United States Patent [19]

Ozaki

[11] Patent Number: 5,508,887
[45] Date of Patent: Apr. 16, 1996

[54] TELEVISION RECEIVER CONTROL BOX

[75] Inventor: Arthur H. Ozaki, Escondido, Calif.

[73] Assignees: Sony Corporation, Tokyo, Japan; Sony Electronics, Inc., Park Ridge, N.J.

[21] Appl. No.: 363,404

[22] Filed: Dec. 22, 1994

[51] Int. Cl.$^6$ .................................................. H05K 5/00
[52] U.S. Cl. .............................. 361/752; 361/796
[58] Field of Search ........................... 361/736, 752–758, 361/759, 796–797, 800–801, 816, 818; 174/52.1

[56] References Cited

U.S. PATENT DOCUMENTS

| | | | |
|---|---|---|---|
| 4,912,602 | 3/1990 | Zurek et al. | 361/752 |
| 4,916,578 | 4/1990 | Mast | 361/818 |
| 5,278,351 | 1/1994 | Herrick | 361/818 |
| 5,381,304 | 1/1995 | Theroux et al. | 361/736 |

*Primary Examiner*—Bot L. Ledynh
*Attorney, Agent, or Firm*—Blakely, Sokoloff, Taylor & Zafman

[57] ABSTRACT

A control box for a television set. The control box has a cover that is attached to a base plate to enclose a printed circuit board. The printed circuit board is supported by a plurality of support tabs that extend from the base plate. A front panel member is attached to a front wall of the base plate. The front panel has a plurality of support bars that extend through the base plate wall and restrain an edge of the printed circuit board such that the circuit board does not require any fasteners to secure the board to the base plate. The cover has a pair of side walls with chamfered surfaces that extend to the base plate. Extending from each chamfered surface is a lip. Each lip has a plurality of holes which are aligned with tabs that extend from the base plate. The cover is attached to the base plate by fasteners that are screwed into the cover and the tabs. The screws are located on the bottom of the control box and are not generally visible to the end user.

8 Claims, 2 Drawing Sheets

TELEVISION RECEIVER CONTROL BOX

BACKGROUND OF THE INVENTION

1. Field of the Invention

The present invention relates to a television receiver control box for a television set.

2. Description of Related Art

To improve reception, television sets are sometimes coupled to a cable or satellite system. The systems include a control box that provide an interface for the television. The control boxes are typically placed adjacent to the television set in a location that is visible to the end user. Because the control box is visible, it is desirable to provide a box that is aesthetically pleasing.

Television control boxes typically have a cover that is attached to a base plate to enclose a printed circuit board assembly. Both the cover and the printed circuit board are secured to the base plate by screws. Fastening screws increases the assembly time and cost of producing the control boxes. It is therefore desirable to have a control box which has a minimal number of screws. Additionally, it would also be desirable to have a control box which has compound surfaces and does not reveal the screws that fasten the cover to the base plate. Such a design must have enough structural integrity to prevent damage to the electronic components when the control box is shipped and handled.

SUMMARY OF THE INVENTION

The present invention is a control box for a television set, The control box has a cover that is attached to a base plate to enclose a printed circuit board, The printed circuit board is supported by a plurality of support tabs that extend from the base plate. A front panel member is attached to a front wall of the base plate. The front panel has a plurality of support bars that extend through the base plate wall and restrain an edge of the printed circuit board such that the circuit board does not require any fasteners to secure the board to the base plate, The cover has a pair of side walls with chamfered surfaces that extend to the base plate. Extending from each chamfered surface is a lip, Each lip has a plurality of holes which are aligned with tabs that extend from the base plate, The cover is attached to the base plate by fasteners that are screwed into the cover and the tabs, The screws are located on the bottom of the control box and are not generally visible to the end user,

BRIEF DESCRIPTION OF THE DRAWINGS

The objects and advantages of the present invention will become more readily apparent to those ordinarily skilled in the art after reviewing the following detailed description an accompanying drawings, wherein.

DETAILED DESCRIPTION OF THE INVENTION

Figure 1:
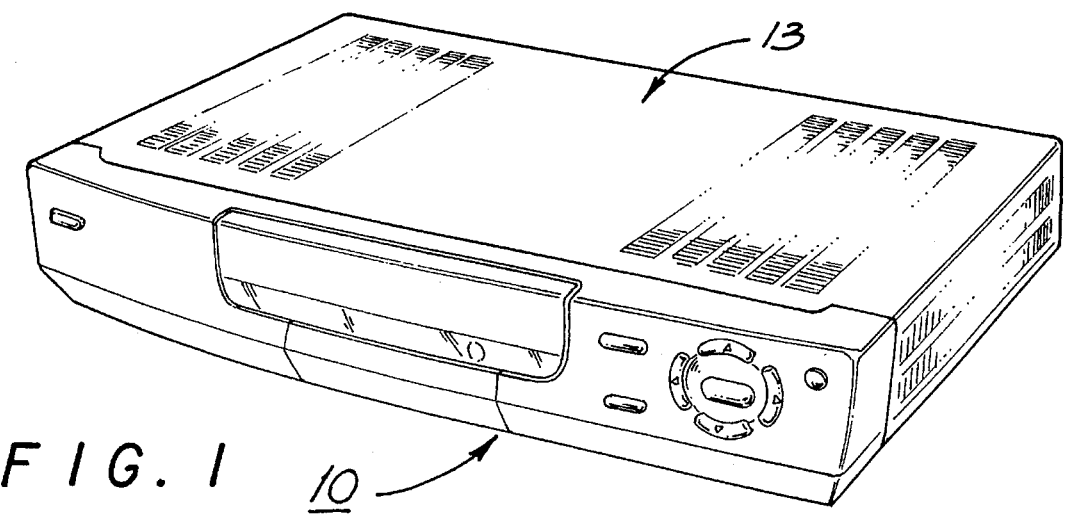
FIG. 1 is a perspective view of a television receiver control ox of the present invention.
Figure 2:
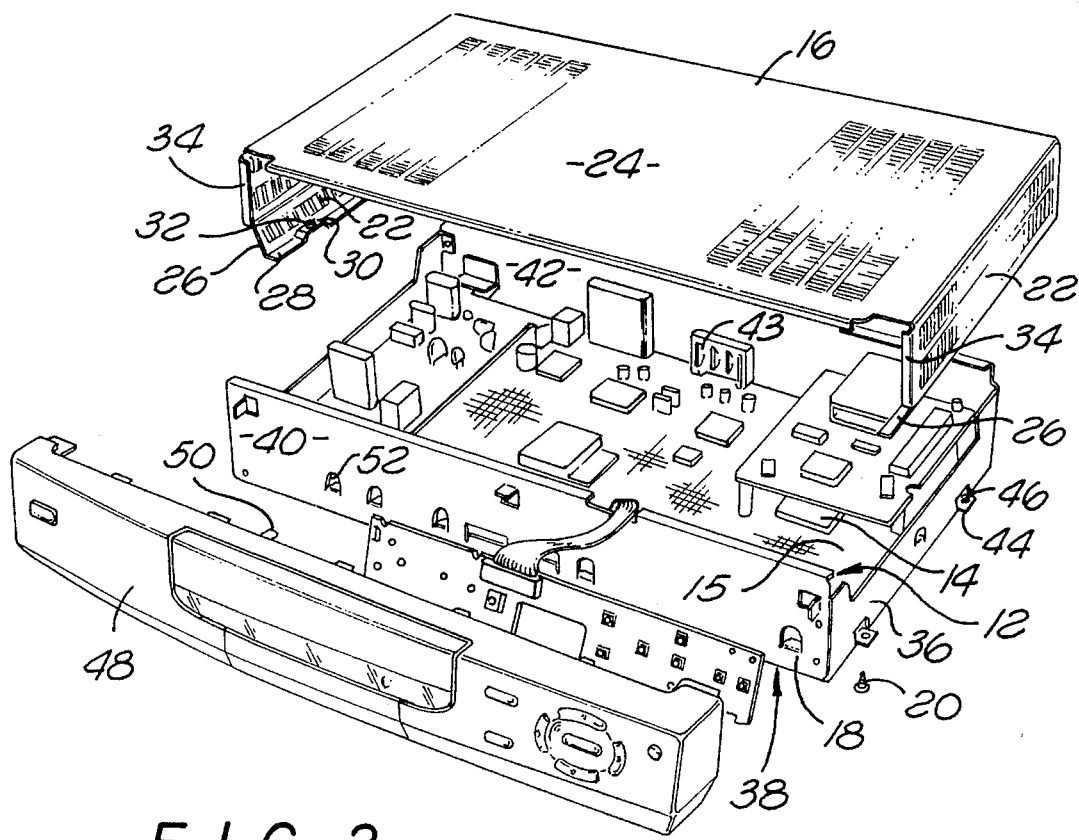
FIG. 2 is an exploded view of the television receiver control box.

Referring to the drawings more particularly by reference numbers, FIGS. 1 and 2 show a media control box 10 of the present invention. The control box 10 contains a printed circuit board assembly 12 that is enclosed by a housing 13. The printed circuit board assembly 12 contains a plurality of integrated circuits 14 and accompanying hardware that are mounted to a printed circuit board 15. The integrated circuits can provide an interface between a television set (not shown) and a television broadcasting system (not shown). By way of example, the control box 10 may be coupled to a residential satellite dish of a satellite broadcasting system.

The housing 13 includes a cover 16 that is attached to a base plate 18 by a plurality of screws 20. The cover 16 has a pair of side walls 22 that extend from a top portion 24. The control box 10 is typically located on top of, or otherwise adjacent to, a the television set, and is thus visible to the end user. For this reason it is desirable to provide a control box that is aesthetically pleasing. To this end, the housing 12 preferably has a pair of chamfer wall portions 26 extending from the side walls 22. Extending from each chamfer wall portion 26 is a lip 28. Each lip 28 preferably has a plurality of indented segments 30 which each have a hole 32. The cover 16 is preferably a relatively light and strong material such as an electro-galvanized steel sheet which is stamped into the configuration shown. To improve the structural integrity of the cover 16, the side walls 22 may have a pair of tabs 34 extending therefrom.

The base plate 18 has a pair of side walls 36 that extend from a bottom plate portion 38. The base plate 18 also has a front wall 40 and a back wall 42 that extend from the bottom portion 38. The base plate 18 is typically constructed from a sheet of electro-galvanized steel stamped into the configuration shown. Mounted to the back wall 42 are a plurality of electrical connectors 43 that are coupled to the printed circuit board assembly 12 and provide a mechanical interface between the control box 10, television set and the broadcasting system. Attached to the side walls 36 of the base plate 18 are a plurality of tabs 44 offset from the bottom surface of the plate 18. Each tab 44 has a clearance hole 46.

Figure 3:
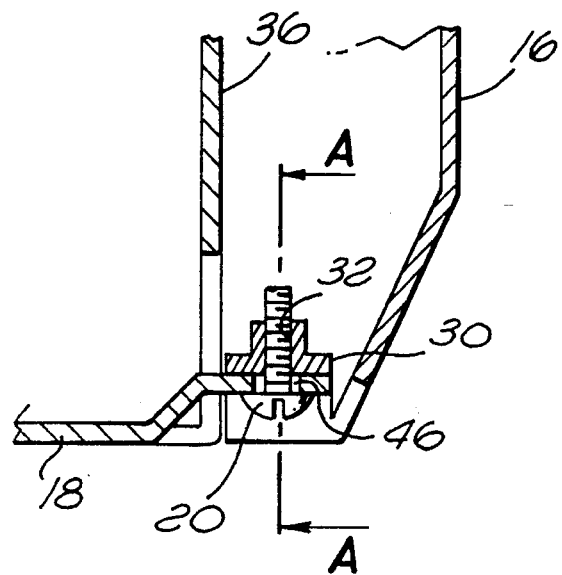
FIG. 3 is a side cross-sectional view showing a screw that fastens a cover to a base plate.
Figure 3A:
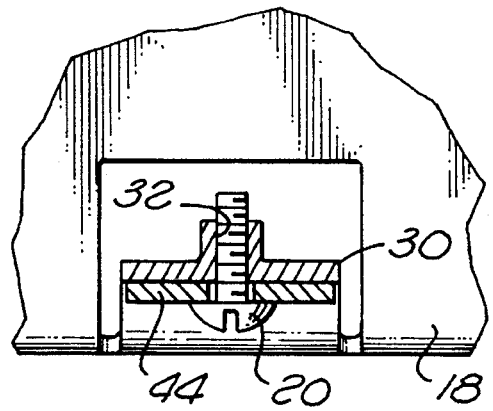
FIG. 3a is a cross-sectional view taken at line A—A of FIG. 3.

As shown in FIG. 3, when assembled, the clearance holes 32 of the cover 16 are aligned with the holes 46 of the tabs 44, such that the screws 20 fasten the cover 16 to the base plate 18. The screws 20 are preferably self tapping. With the present invention, the heads of the screws 20 extend from the bottom of the housing 12 so as not to be visibly apparent to the end user, thus improving the overall appearance of the control box 10. The offset tabs 44 and indented lip segments 30 further conceal the screws 20 from the end user.

Referring to FIG. 1, the housing 12 further has a front panel member 48 that is attached to the front wall 40 of the base plate 18. The front panel member 48 is preferably constructed from a molded plastic piece which is painted and contains contoured surfaces to improve the appearance of the control box 10. The front panel member 48 has a plurality of support bars 50 that extend through a plurality of clearance holes 52 in the front wall 40.

Figure 4:
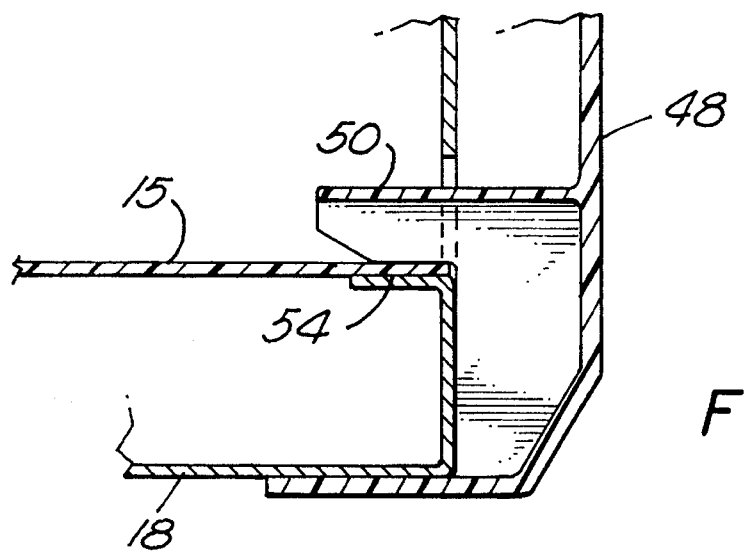
FIG. 4 is a side sectional view showing a support bar restraining an edge of a printed circuit board assembly.

As shown in FIG. 4, the support bars 52 restrain an edge of the printed circuit board 15, thereby restricting movement of the circuit board assembly 12. The bottom of the printed circuit board 15 is supported by support tabs 54 which are stamped from the base plate 18. The present invention provides a control box assembly wherein the internal printed circuit board assembly 12 does not have to be secured to the base plate 18 by screws or other fasteners. The absence of screws or other fasteners, reduces the assembly time and overall cost of producing the control box 10. It may be desirable to ground the printed circuit board assembly with screws that are fastened to the support tabs 54 of the base plate 18. With such an embodiment, the support bars 52 should be located so that the screws are accessible even when the front panel 48 is attached to the base plate 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A television receiver control box, comprising:

a housing that has an inner cavity and a support tab;

a printed circuit board located within said inner cavity, said printed circuit board having a first edge and a second opposite edge, said printed circuit board further having a first side and an opposite second side that is supported by said support tab of said housing; and, a front panel that is attached to said housing and which has a support bar that is in contact with said first side of said printed circuit board, said support bar and said support tab restrain said first edge of said printed circuit board.

2. The control box as recited in claim 1, wherein said housing includes a cover attached to a base plate, said cover having a pair of chamfer wall portions which each have a lip, said lips having apertures that are aligned with a plurality of corresponding tabs that extend from said base plate, said housing further having fasteners to attach said lips to said corresponding tabs.

3. The control box as recited in claim 2 wherein said corresponding tabs are inset from a bottom surface of said base plate.

4. The control box as recited in claim 1, further comprising a plurality of support tabs that are bent from a plurality of walls of said housing and which support said printed circuit board.

5. A television receiver control box, comprising:

a base plate which has an inner cavity and a plurality of tabs;

a printed circuit board located within said inner cavity;

a cover which has a top surface, and a pair of side walls essentially perpendicular to said top surface, wherein each side wall has a chamfer wall portion and a lip that is essentially parallel with said top surface, said lips having a plurality of apertures that are aligned with said tabs of said base plate; and, a plurality of fasteners that attach said lips to said tabs.

6. The control box as recited in claim 5, wherein said tabs are inset from a bottom surface of said base plate.

7. The control box as recited in claim 5, further comprising a plurality of support tabs that are bent from a plurality of walls of said base plate and which support said printed circuit board.

8. The control box as recited in claim 5, further comprising a front panel that is attached to said base plate and which has a plurality of tabs that restrain a first edge of said printed circuit board.

* * * * *

UNITED STATES PATENT AND TRADEMARK OFFICE
CERTIFICATE OF CORRECTION

PATENT NO.    :   5,508,887
DATED         :   April 16, 1996
INVENTOR(S)   :   Ozaki It is certified that error appears in the above-identified patent and that said Letters Patent is hereby corrected as shown below:

Column 1, line 34, after "set" delete "," and insert --.--
Column 1, line 36, after "board" delete "," and insert --.--
Column 1, line 43, after "plate" delete "," and insert --.--
Column 1, line 45, after "lip" delete "," and insert --.--
Column 1, line 47, after "plate" delete "," and insert --.--
Column 1, line 48, after "tabs" delete "," and insert --.--
Column 1, line 50, after "user" delete "," and insert --.--
Column 1, line 55, after "an" insert --d--
Column 1, line 58, before "ox" insert --b--
Column 4, line 3, after "2" insert --,--

Signed and Sealed this

Twenty-seventh Day of August, 1996

Attest:

BRUCE LEHMAN

*Attesting Officer*    *Commissioner of Patents and Trademarks*